(12) United States Patent
Okada

(10) Patent No.: US 7,152,218 B2
(45) Date of Patent: Dec. 19, 2006

(54) BEHAVIORAL SYNTHESIS SYSTEM, BEHAVIORAL SYNTHESIS METHOD, CONTROL PROGRAM, READABLE RECORDING MEDIUM, LOGIC CIRCUIT PRODUCTION METHOD, AND LOGIC CIRCUIT

(75) Inventor: Kazuhisa Okada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 316 days.

(21) Appl. No.: 10/829,152

(22) Filed: Apr. 22, 2004

(65) Prior Publication Data

US 2004/0237056 A1 Nov. 25, 2004

(30) Foreign Application Priority Data

Apr. 24, 2003 (JP) ............................. 2003-120600

(51) Int. Cl.
*G06F 17/50* (2006.01)
(52) U.S. Cl. ...................................................... 716/18
(58) Field of Classification Search ...................... None
See application file for complete search history.

(56) References Cited

U.S. PATENT DOCUMENTS 5,555,201 A * 9/1996 Dangelo et al. ................ 716/1
6,964,029 B1 * 11/2005 Poznanovic et al. ........... 716/7

FOREIGN PATENT DOCUMENTS

JP 2001-142937 A 5/2001
JP 2001-229217 A 8/2001

OTHER PUBLICATIONS

Chen et al., "Multipar: Behavioral Partition for Synthesizing Multiprocessor Architectures," IEEE Transactions on VLSI Systems, vol. 2, No. 1, Mar. 1994, pp. 21-32.*
Percolation Based Synthesis, Roni Potasman et al., Dept. of Electrical and Computer Engineering, Information and Computer Science Dept., Universtiy of California, Irvine, CA 92717, IEEE, 1990, pp. 444-449.
Gajski et al., *High-Level Synthesis Introduction to Chip and System Design*, Kluwer Academic Publishers, Norwell, Massachusetts, 1992, pp. 138-296.
Kambe et al., *A C-based Synthesis System, Bach, and its Application*, IEEE Catalog No. 01EX455, ISBN: 0-7803-6633-6).

* cited by examiner

*Primary Examiner*—Leigh M Garbowski
(74) *Attorney, Agent, or Firm*—Birch, Stewart, Kolasch & Birch, LLP

(57) ABSTRACT

A behavioral synthesis system is provided, which includes a section for generating a control data flow graph from a behavioral description containing a loop process and a non-loop process, using nodes representing processing sections and input/output branches representing data flow, and a section for automatically synthesizing hardware structure at a register transfer level using the control data flow graph. A loop process portion of the control data flow graph represents that the nodes contained in the loop process are divided into pipelined stages and processes of the pipelined stages are executed in parallel in each of a plurality of the loop processes. The control data flow graph generating section includes, in the loop process portion, a loop control portion for outputting control signals for executing at least the non-loop process of the loop process and the non-loop process, to the nodes in the stages.

15 Claims, 15 Drawing Sheets

FIG.3

| Cycle | V1 | V2 | V3 |
|-------|----|----|----|
| 1     | 1  | 0  | 0  |
| 2     | 1  | 1  | 0  |
| 3~10  | 1  | 1  | 1  |
| 11    | 0  | 1  | 1  |
| 12    | 0  | 0  | 1  |

FIG.4

| Cycle | V1 | V2 | V3 |
|-------|----|----|----|
| 1     | 1  | 0  | 0  |
| 2     | 0  | 1  | 0  |
| 3     | 0  | 0  | 1  |

FIG.5

```
j = 5;
for (i = 0; i<10 ; i++)
{
   a[i] = i ;
   j += i ;
   b[i] = j ;
}
```

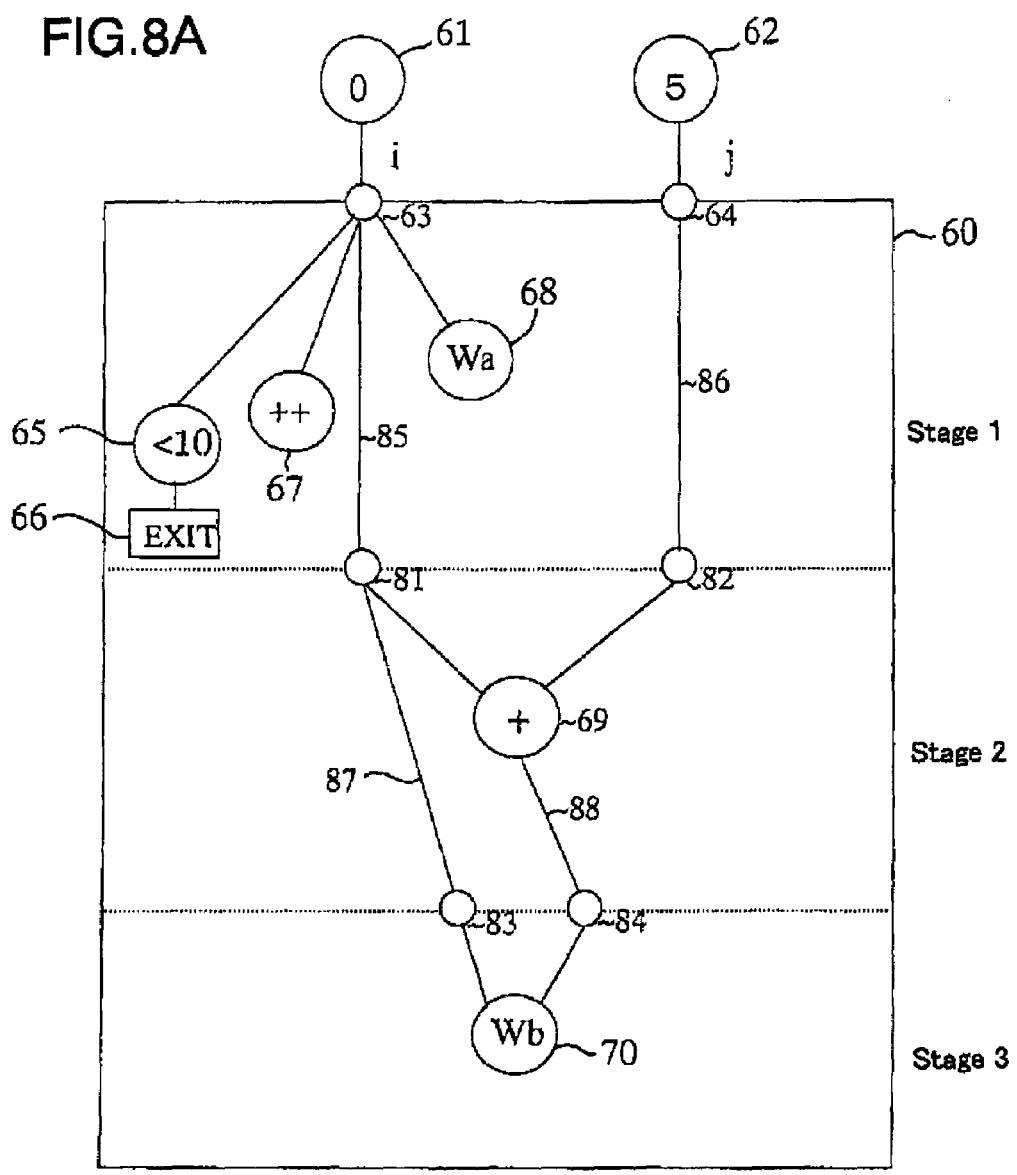

(a)

(b)

(c)

(d)

(e)

(f)

FIG.10 CONVENTIONAL ART
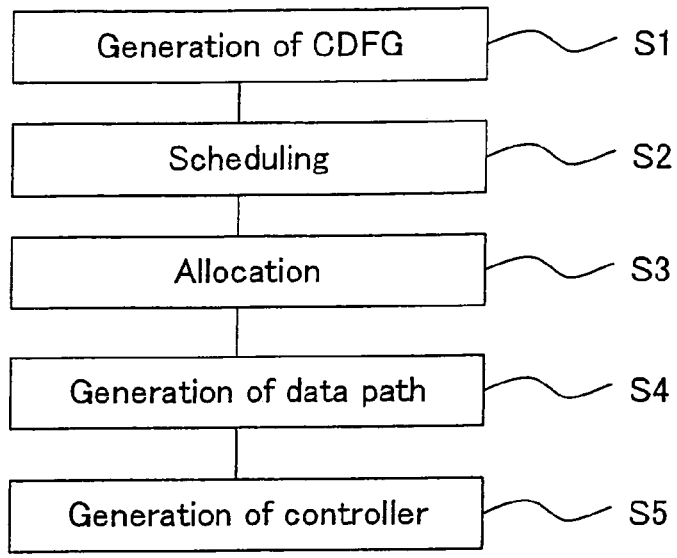
FIG.11 CONVENTIONAL ART
$$x = a \times b + b \times c$$
FIG.12 CONVENTIONAL ART
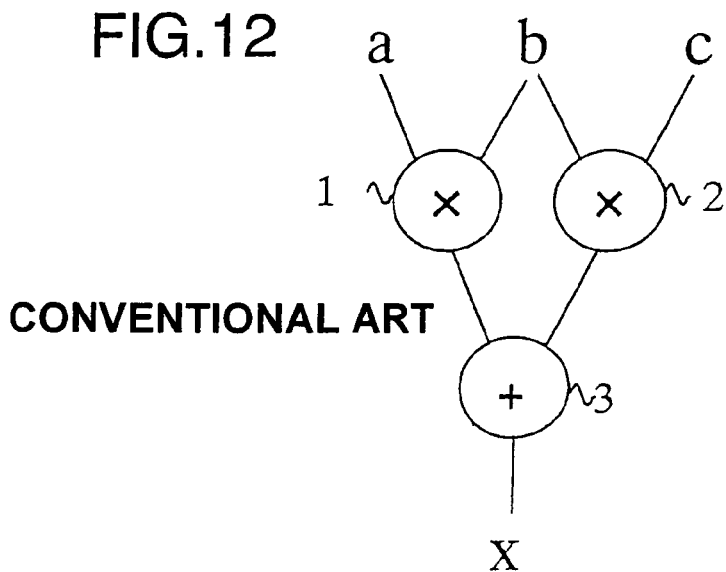

FIG.13

```
struct Node
  {
    int   node_id;
    int   in_edge[2];
    int   out_edge[1];
    int   op_type;
  }
struct Edge
  {
    int   edge_id;
    int   from_node;
    int   to_node;
  }
```

CONVENTIONAL ART

FIG.14

CONVENTIONAL ART

```
for( i =0; i <=10 ; i++)
{
    f(i);
    g(i);
    h(i);
}
```

CONVENTIONAL ART

FIG.16

Cycle 1   f(1)

Cycle 2   g(1)   f(2)

Cycle 3   h(1)   g(2)   f(3)

Cycle 4   h(2)   g(3)   f(4)

Cycle 9   h(7)   g(8)   f(9)

Cycle 10   h(8)   g(9)   f(10)

Cycle 11   h(9)   g(10)

Cycle 12   h(10)

CONVENTIONAL ART

BEHAVIORAL SYNTHESIS SYSTEM, BEHAVIORAL SYNTHESIS METHOD, CONTROL PROGRAM, READABLE RECORDING MEDIUM, LOGIC CIRCUIT PRODUCTION METHOD, AND LOGIC CIRCUIT

This non-provisional application claims priority under 35 U.S.C. §119(a) on Patent Application No. 2003-120600 filed in Japan on Apr. 24, 2003, the entire contents of which are hereby incorporated by reference.

BACKGROUND OF THE INVENTION

1. Field of the Invention

The present invention relates to a behavioral synthesis system for generating a pipelined control data flow graph corresponding to behavioral descriptions including a description of a loop process. The present invention also relates to a behavioral synthesis method for automatically synthesizing a circuit at a Register Transfer Level (RTL) using the behavioral synthesis system. The present invention also relates to a control program for causing a computer to execute a procedure for automatically synthesizing a circuit, a computer readable recording medium storing the control program. These are used in designing, for example, a logic circuit. The present invention also relates to a method for producing a logic circuit using the behavioral synthesis system, and a logic circuit produced by the method.

2. Description of the Related Art

Conventionally, a behavioral synthesis process for producing an RTL logic circuit diagram based on behavioral descriptions is employed in designing large-scale circuits, such as system LSIs comprising a logic circuit.

The behavioral synthesis process is also called high-level synthesis process. In this process, RTL level hardware (circuit diagram) is automatically synthesized based on behavioral descriptions which contain only algorithms for data processing but not information on hardware structure.

"A C-based Synthesis System, Bach, and its Application", Proceedings of the ASP-DAC 2001, 2001 (IEEE Catalog Number 01EX455, ISBN: 0-7803-6633-6) discloses a behavioral synthesis system, which is a computer system for synthesizing hardware (circuit diagram) by using an extended C language for hardware design as a behavioral description language.

"High Level Synthesis", Kluwer Academic Publishers, 1992 (ISBN:0-7923-9194-2) reviews conventional behavioral synthesis techniques in detail. Conventional behavioral synthesis technology relates to a process for obtaining desired hardware (circuit diagram) from a control data flow graph (CDFG).

Hereinafter, a conventional behavioral synthesis apparatus and a conventional behavioral synthesis method (high-level synthesis method) for automatically synthesizing a desired circuit diagram based on behavioral descriptions, will be described.

The behavioral synthesis apparatus comprises a computer system. The behavioral synthesis apparatus comprises a CDFG generating section, a scheduling section, an allocation section, a data path generating section, and a controller generating section. The behavioral synthesis apparatus is used to successively execute steps in a behavioral synthesis process, thereby automatically synthesizing (designing) an RTL (register transfer level) hardware (circuit diagram).

FIG. 10 shows a behavioral synthesis process which is executed by the behavioral synthesis apparatus.

In stop S1, a control data flow graph (CDFG) is generated. The CDFG generating section analyzes a data flow indicated by an algorithm description (behavioral description) to produce a model called CDFG. The CDFG comprises at least one node which represents an operation, and at least one branch which represents data flow. An input branch and an output branch are connected to each node. An input branch represents data used in an operation, while an output branch represents data resulting from an operation. Each node also has information of the type of an operation.

FIG. 11 shows a behavioral description which is described in the C language.

FIG. 12 shows a CDFG corresponding to the behavioral description of FIG. 11.

The CDFG of FIG. 12 comprises a node 1 representing a multiplication, a node 2 representing a multiplication, and a node 3 representing an addition. At the node 1, input data a is multiplied by input data b. At the node 2, input data b is multiplied by input data c. At the node 3, the result of the multiplication at the node 1 is added with the result of the multiplication at the node 2. The result of the addition at the node 3 is output as output data x.

FIG. 13 shows a data structure corresponding to the CDFG of FIG. 12.

In the data structure of FIG. 13, a node is represented by a structure Node. The structure Node comprises a node_id representing a node-specific node number, an in_edge array, an out_edge array, and an op_type. The in_edge array has the branch number of at least one input branch. The out_edge array has the branch number of at least one output branch. The node of FIG. 13 represents an operation having 2 inputs and 1 output. The in_edge has two elements, while the out_edge has one element. The op_type has a number representing the type of each operation (addition, subtraction, multiplication, etc.).

In the data structure of FIG. 13, a branch is represented by a structure Edge. The structure Edge comprises an edge_id representing a branch identifying number, a from_node, and a to_node. The from_node and the to_node each have a node number representing a node connected to a branch having a prescribed branch number.

The data structure (data representing a connection between each node in CDFG) of FIG. 13 is stored in a memory of a computer (computing machine).

In order to connect a branch to a node or find a node inputted to or outputted from a prescribed node, a node number or a branch number is input to or referred from the memory of the computer.

Hereinafter, for the sake of simplicity, explanation will be performed with reference to FIG. 12 which visually represents a CDFG, in which a branch is connected to a prescribed node, and another node is connected to the input or output of the prescribed node.

Referring to FIG. 10 again, a procedure for behavioral synthesis will be described.

In step S2, the scheduling section performs a scheduling process for a CDFG generated.

The scheduling process is a process for determining when an operation represented by a node is executed. In the scheduling process, a node indicated in a CDFG is divided into several steps. One step is executed during one clock cycle.

In step S3, the allocation section performs an allocation process. An allocation process is also called a binding process, and comprises determining a register for storing data represented by a branch, and determining an operator for executing an operation represented by a node. In some behavioral synthesis methods (high-level synthesis methods), an allocation process may be executed before a scheduling process.

In step S4, the data path generating section generates a data path based on the results of scheduling and allocation.

In step S5, the controller generating section generates a controller based on the results of scheduling and allocation.

By executing steps S1 to step S5, RTL (register transfer level) hardware (circuit diagram) is automatically synthesized (designed). The details of step S1 to step S5 are described in "High Level Synthesis" (supra). An example of this technique is described in Japanese Laid-Open Publication No. 2001-229217.

Behavioral descriptions representing a process to be executed by an actually designed circuit typically contain a description indicating a loop process. A loop process is repeatedly executed a number of times. Therefore, the time required to process data is dominantly occupied by the time for a loop process.

Therefore, an effective way for speeding up a data process is to speed up a loop process. For example, image processing or speech processing needs to be completed within a prescribed time. It is essential to design a circuit capable of high-speed loop processing so as to meet a demand for high-speed data processing.

For example, a loop process is pipelined in order to realize a high-speed loop process.

"Percolation Based Synthesis", Proceedings of Design Automation Conference 1990, pp. 444–448 (IEEE) discloses a method for pipelining a conventional loop process. This method is also illustrated in FIG. 3(e) of Japanese Laid-Open Publication No. 2001-142937.

Hereinafter, a method for pipelining a conventional loop process will be described.

FIG. 14 shows an exemplary behavioral description including a description representing a loop process.

The behavioral description of FIG. 14 represents an operation, in which functions f(i), g(i) and h(i) are executed while a condition is 10 is satisfied, where an integer variable i is incremented by one from i=0.

FIG. 15 shows a CDFG corresponding to the behavioral description of FIG. 14. A loop process represented by the CDFG is not yet pipelined.

The CDFG of FIG. 15 comprises a loop process portion 10. The loop process portion 10 comprises an increment operation node 14, a port 12 at an upper end of the loop process portion 10, and a port 13 at a lower and of the loop process portion 10. The port 12 and the port 13 each store the variable i of FIG. 14. The value (data) of the variable i stored in the port 12 is incremented by one by the increment operation node 14, and the resultant value is stored in the port 13. The data reaching the port 13 is fed back to the port 12 for the next loop. The data reaching the port 13 and the data fed back to the port 12 for the next loop indicate the same variable. A node 11 located outside the loop process portion 10 outputs a constant. The node 11 provides an initial value of the variable 1 to the port 12.

In the behavioral description of FIG. 14, only the variable i is repeatedly used in the loop process portion 10. If two or more variables are repeatedly used in the loop process portion, a number of pairs of ports (e.g., the port 12 and the port 13) corresponding to the number of the variables are provided.

The CDFG of FIG. 15 further comprises a terminating condition determining node 15, an "EXIT" node 16, and nodes 17 to 19.

The terminating condition determining node 15 determines whether or not a terminating condition is satisfied. If the terminating condition is "true" (i≦10), data "1" is output. If the terminating condition is "false", data "0" is output.

The "EXIT" node 16 is a special node which controls the termination of the loop process portion 10. If the data output by the terminating condition determining node 15, which is input to the "EXIT" node 16, is "0" (the variable i is equal to or less than 10), the "EXIT" node 16 instructs a controller (not shown) to end the process of the loop process portion 10 and undergo transition to the next state.

The node 17 executes an operation relating to the function f. The node 18 executes an operation relating to the function g. The node 19 executes an operation relating to the function h. The value of the variable i is input to the node 17, the node 18 and the node 19. The node 17, the node 18, and the node 19 are scheduled to be executed in step 1, step 2, and step 3, respectively.

During a first clock cycle, the node 17 contained in step 1 of a first loop process calculates f(1). During a second clock cycle, the node 18 contained in step 2 of the first loop process calculates g(1). During a third clock cycle, the node 19 contained in step 3 of the first loop process calculates h(1).

During a fourth clock cycle, the node 17 contained in step 1 of a second loop process calculates f(2). During a fifth clock cycle, the node 18 contained in step 2 of the second loop process calculates g(2). During a sixth clock cycle, the node 19 contained in step 3 of the second loop process calculates h(2). Therefore, 30 cycles of processes are required to perform a loop process 10 times.

Note that no fixed format is used to represent a loop process with a CDFG. Although the format varies from document to document, the behavior is the same.

Next, an exemplary method for pipelining a loop process represented by the behavioral description of FIG. 14 will be described.

A loop process is pipelined using, for example, three stages. In other words, a single loop process is divided into three stages. Note that a stage means a group of processes for a pipeline operation.

The loop process in the behavioral description of FIG. 14 is scheduled using only three steps during one loop cycle unless the process is not pipelined. Therefore, when the loop process is pipelined, step 1, stop 2, and step 3 are assigned to stage 1, stage 2, and stage 3, respectively.

Alternatively, for example, an unpipelined loop process may be scheduled using 4 steps. When the 4 steps are divided into 2 stages for a pipelined process, steps 1 and 2 are assigned to stage land steps 3 and 4 are assigned to stage 2. In this case, 2 cycles are required to execute one stage.

In a pipelined circuit, processes as shown in FIG. 16 are performed.

Referring to FIG. 16, during a first clock cycle, only f(1) is executed. Next, during a second clock cycle, g(1) is executed, while a second loop process is started so that f(2) is executed. During a third clock cycle, h(1) is executed, while the first loop process is ended and at the same time g(2) in a second loop process and f(3) in a third process are simultaneously executed. Thereafter, during a $k^{th}$ clock cycle, h(k−2), g(k−1) and f(k) are simultaneously executed. Subsequently, during a $11^{th}$ clock cycle, only h(9) and g (10) are executed. During a $12^{th}$ clock cycle, only h(10) is executed. Thus, the loop process is ended.

As described above, 30 cycles are required for execution of the behavioral description of FIG. 14 when a loop process is not pipelined. When a loop process is pipelined, only 12 cycles are required.

FIG. 17 shows a CDFG when the loop process in the behavioral description of FIG. 14 is pipe lined with a conventional method. In the CDFG of FIG. 17, scheduling is also performed, so that nodes are divided into steps.

As shown in the CDFG of FIG. 17, only f(1) is executed in step 1, and g(1) and f(2) are simultaneously executed in step 2.

Next, the process goes to a loop process portion 21 contained in step 3. Note that in the loop process portion 21, one cycle is required to perform one process. The number of cycles requited depends on the number of repetitions of the loop process. Therefore, in step 4 and thereafter, the number of steps is different from the number of cycles.

In the loop process portion 21, stages 1 to 3 are arranged in parallel. A node 22 provides an initial value 3 to a loop variable i. Nodes 23 and 24 subtract 1 and 2, respectively, from an input value. Therefore, during a first loop process, nodes 25, 26 and 27 simultaneously execute f(3), g(2) and h(1), respectively. Next, during a second loop process, f(4), g(3) and h(2) are simultaneously executed. After third to seventh loop processes are executed, f(10), g(9) and h(8) are simultaneously executed during an eighth loop process. At a node 28, the condition (i≦10) is examined. If the condition is not satisfied, the process of the loop process portion 21 is ended. The process goes to the next step 4.

In step 4, g(10) and h(9) are executed. Next, in step 5, only h(10) is executed.

In the CDFG of FIG. 17, the process of a portion 20 executed before the loop process portion 21 is designated as a prologue portion, while a portion 29 after the loop process portion 21 is designated as an epilogue portion.

By producing such a CDFG, a loop process can be pipelined, thereby making it possible to speed up the process.

However, when a loop process is pipelined using a conventional method as shown in FIG. 17, a prologue portion and an epilogue portion are required before and after a loop process portion in a CDFG, respectively. As a result, the resultant CDFG is complicated. Therefore, when behavioral synthesis is performed from the CDFG to produce hardware (circuit diagram), the resultant hardware has a large area, resulting in an increase in manufacturing cost for a chip.

For the CDFG obtained by pipelining a loop process using such a conventional method, the prologue portion and the epilogue portion are inevitably executed without determining the loop repetition condition. Therefore, if the loop itself is ended before the execution of the prologue portion, a proper behavior is not obtained. For example, in the case of the behavioral description of FIG. 14, if the number of repetitions of a loop process is one, only f(1), g(1) and h(1) need to be executed. However, f(2) is executed during the second cycle. For example, if f(2) includes a process, such as memory writing or external communication, an improper value may be written into a memory or an unnecessary value may be externally sent out, i.e., a circuit may malfunction.

To avoid such a malfunction, it may be conceived to introduce a CDFG, in which the case where the number of repetitions of a loop process is small is, assigned to a separate portion of the CDFG. In this case, the resultant CDFG is complicated and hardware (circuit diagram) area is increased.

SUMMARY OF THE INVENTION

According to an aspect of the present invention, a behavioral synthesis system is provided, which comprises a section for generating a control data flow graph from a behavioral description containing a loop process and a non-loop process, using nodes representing processing sections and input/output branches representing dataflow, and a section for automatically synthesizing hardware structure at a register transfer level using the control data flow graph. A loop process portion of the control data flow graph represents that the nodes contained in the loop process are divided into pipelined stages and processes of the pipelined stages are executed in parallel in each of a plurality of the loop processes. The control dataflow graph generating section comprises, in the loop process portion, a loop control portion for outputting control signals for executing at least the non-loop process of the loop process and the non-loop process, to the nodes in the stages.

In one embodiment of this invention, the loop control portion comprises a plurality of ports for outputting the control signals to the nodes in the stages, and a terminating condition determining node for determining termination, the terminating condition determining node being connected to one or more prescribed ports of the plurality of ports.

In one embodiment of this invention, the loop process portion comprises a loop port for receiving a prescribed initial value and successively outputting a value obtained by incrementing the input initial value by one per cycle, a number-of-loops determining node for counting an output from the loop port, determining whether or not the number of loop processes reaches a prescribed number of loop processes, and outputting a result of the determination as a determination output to the loop control portion, and the nodes in the stages.

In one embodiment of this invention, the loop control portion receives the determination output from the number-of-loops determining node, and outputs the control signal for allowing the node in the stage to execute a non-loop process, from the port of the loop control portion.

In one embodiment of this invention, the plurality of ports have a shift register function having the same number of bits as the number of the pipelined stages.

In one embodiment of this invention, the plurality of ports supply control signals obtained by successively shifting a prescribed input initial value for each cycle using the shift register function, to the nodes in the stages.

In one embodiment of this invention, a node of the nodes in the stages, which has an action external to the loop process portion, is controlled using the control signal from the loop control portion.

In one embodiment of this invention, the control data flow graph generating section generates a control data flow graph of a pipelined loop process based on a control data flow graph of an unpipelined loop process.

In one embodiment of this invention, the control data flow graph generating section comprises a port adding section for newly adding a port at an intersection of a boundary between the stages and a graph branch in the control data flow graph of the unpipelined loop process, a side-by-side arranging section for arranging the stages to represent parallel processing, a branch connecting section for connecting a data transfer branch between loops with respect to the stages in the loop process portion, and a loop control portion adding section for providing the loop control portion in the loop process portion.

In one embodiment of this invention, the branch connecting section generates a selector node for selecting one of an initial value provided externally to the loop process portion and a value calculated by the loop process portion and substituting the selected value to a variable in the loop process portion. The loop control portion adding section connects the loop control portion and the selector node so that the control signal output from the loop control portion is used to determine which of the initial value provided externally to the loop process portion and the value calculated by the loop process portion is selected.

According to another aspect of the present invention, a behavioral synthesis method is provided, which comprises the steps of generating a control data flow graph from a behavioral description containing a loop process and a non-loop process, using nodes representing processing sections and input/output branches representing data flow, and automatically synthesizing hardware structure at a register transfer level using the control data flow graph. The control data flow graph generating step comprises dividing the nodes contained in the loop process into pipelined stages, generating a loop process portion for executing processes of the pipelined stages in parallel in each of a plurality of the loop processes, and generating, in the loop process portion, a loop control portion for outputting control signals for executing at least the non-loop process of the loop process and the non-loop process, to the nodes in the stages.

According to another aspect of the present invention, a control program is provided for causing a computer to execute the above-described behavioral synthesis method.

According to another aspect of the present invention, a computer readable recording medium storing the above-described control program is provided.

According to another aspect of the present invention, a method is provided for producing a logic circuit based on a circuit structure automatically synthesized using the above-described behavioral synthesis system.

According to another aspect of the present invention, a logic circuit is provided, which comprises a loop process portion for repeatedly executing operations in parallel using a plurality of logical operation sections, and a loop control portion for outputting a control signal for executing at least a non-loop process of a loop process and the non-loop process to at least one of the plurality of logical operation sections. The loop control portion is provided within the loop process portion.

Hereinafter, functions of the present invention will be described.

According to the present invention, a pipelined control data flow graph (CDFG) is generated from a behavioral description containing a loop process and a non-loop process. The control data flow graph comprises a loop process portion representing that the nodes contained in the loop process are divided into pipelined stages and processes of the pipelined stages are executed in parallel in each of a plurality of the loop processes. A loop control portion is provided within the loop process portion, which outputs control signals for executing at least the non-loop process of the loop process and the non-loop process, to the nodes in the stages.

On the other hand, In conventional structures, when a loop process is pipelined, a prologue portion and an epilogue portion, which are provided before and after the loop process, respectively, are unavoidably executed without determining a condition. Therefore, if a loop process is ended before the execution of the prologue portion, a correct behavior may not be obtained. In addition, since the prologue portion and the epilogue portion are provided separately from the loop process portion, resulting in a large area of hardware.

In the present invention, the functions of the prologue portion and the epilogue portion are contained as a loop control portion in the loop process portion. Therefore, it is not necessary to provide the prologue portion and the epilogue portion separately from the loop process portion. Therefore, it is possible to avoid malfunction and an increase in chip area.

For a simple behavioral description, it is easy to produce a pipelined CDFG. However, when a behavioral description is complicated, it is difficult to produce a pipelined CDFG. In this case, it is effective to produce a CDFG of a pipelined loop process by modifying a CDFG of an unpipelined loop process.

No problem is raised no matter whether or not a node of the nodes contained in the loop process portion, which has no action external to the loop process, is executed. However, when a node having an action external to the loop process is executed, a malfunction may occur. Therefore, it is necessary to control such a node having an action external to the loop process using an output control signal from the loop control portion.

The selector node for selecting one of an initial value provided externally to the loop process portion and a value calculated by the loop process portion and substituting the selected value to a variable in the loop process portion, is controlled using the control signal output from the loop control portion Further, it is possible to control the termination determination of a loop process and a non-loop process using the control signal from the loop control portion.

A logic circuit produced based on a logic circuit diagram designed according to the present invention, comprises a loop control portion. Therefore, the loop process portion has substantially no malfunction. Further, a prologue portion or an epilogue portion is unnecessary, thereby making it possible to reduce chip area.

Thus, the invention described herein makes possible the advantages of providing a behavioral synthesis system which requires no conventional prologue portion or epilogue portion, thereby making it possible to prevent an increase in hardware area and cost; a behavioral synthesis method using the same; a control program for causing a computer to execute the method; a computer readable recording medium storing the program; a method for producing a logic circuit using the same; and a logic circuit producing by the same.

These and other advantages of the present invention will become apparent to those skilled in the art upon reading and understanding the following detailed description with reference to the accompanying figures.

BRIEF DESCRIPTION OF THE DRAWINGS

FIG. 3 is a diagram showing an exemplary output signal from a loop control portion of FIG. 2.

FIG. 4 is a diagram showing another exemplary output signal from a loop control portion of FIG. 2.

FIG. 5 is a diagram showing an exemplary behavioral description including a loop process.

FIGS. 8A to 8D are diagrams showing a procedure for pipelining a CDFG.

FIG. 10 is a flow chart showing a conventional behavior synthesizing method.

FIG. 11 is a diagram showing an exemplary conventional behavioral description.

FIG. 12 is a diagram showing a CDF corresponding to the behavioral description of FIG. 11.

FIG. 13 to a diagram showing a data structure corresponding to the CDFG of FIG. 12.

FIG. 14 is a diagram showing an exemplary behavioral description.

FIG. 16 is a diagram for explaining a conventional pipeline processing.

DESCRIPTION OF THE PREFERRED EMBODIMENTS

Hereinafter, the present invention will be described by way of illustrative embodiments with reference to the accompanying drawings.

Figure 1:
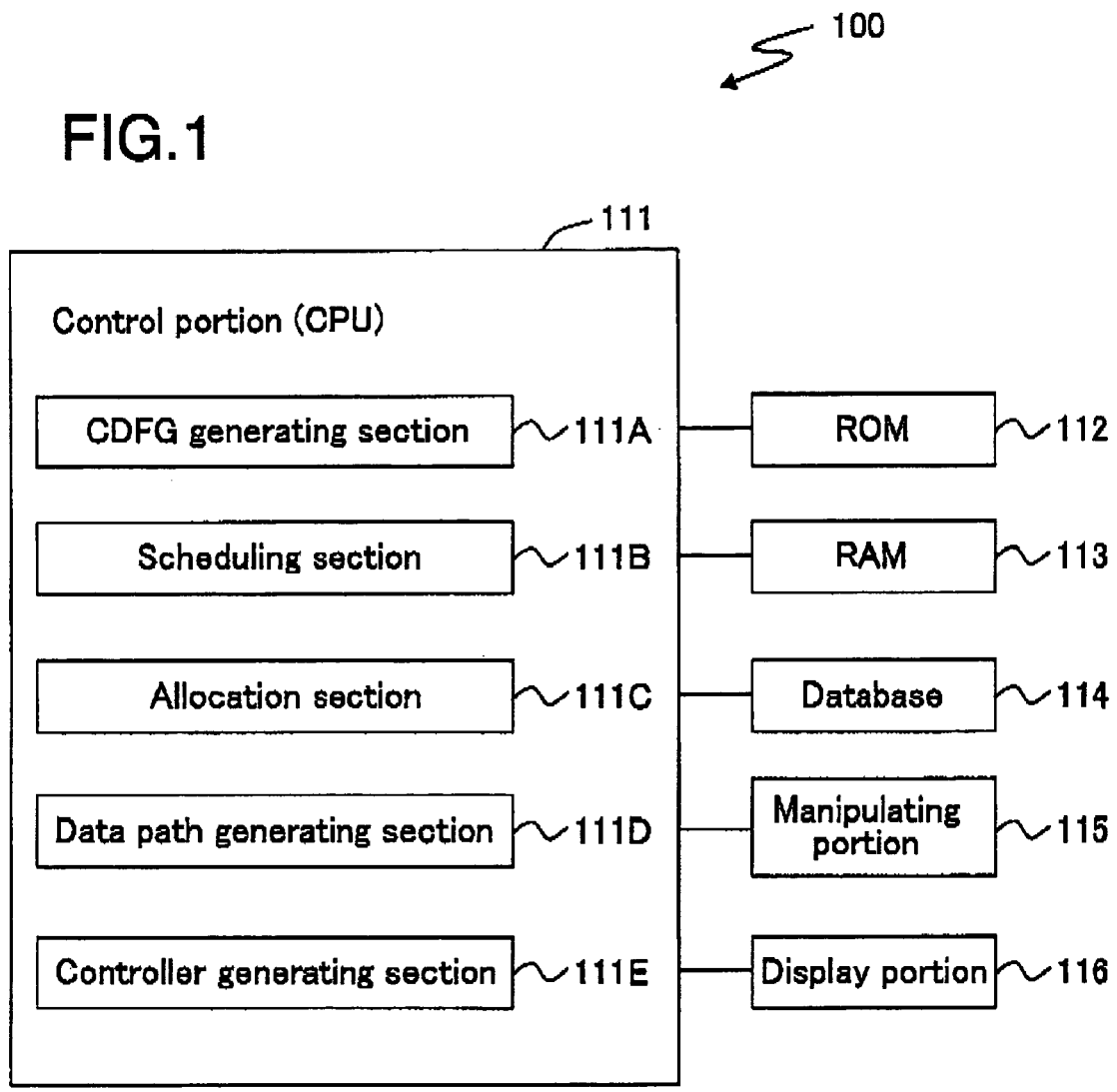
FIG. 1 is a block diagram showing a configuration of a behavioral synthesis system according to an embodiment of the present invention.

FIG. 1 is a block diagram showing a configuration of a behavioral synthesis system according to an embodiment of the present invention.

In FIG. 1, a behavioral synthesis system 100 is a computer system which comprises a control portion 111 for controlling other portions to execute a control program, a ROM 112 storing the control program, relevant data, and the like, a RAM 113 functioning as a working memory during the operation of the control portion 111, a database 114 for recording a variety of data required for circuit design, a manipulating portion 115 for allowing the user to input instructions, and a display portion 116 for displaying various images.

The behavioral synthesis system 100 generates a control data flow graph, which is created by node(s) representing an operation and input/output branch(es) representing a flow of data, based on a behavioral description which records an algorithm comprising a loop process and a non-loop process. The behavioral synthesis system 100 also automatically synthesizes (design) desired hardware (circuit diagram) at a register transfer level (RTL) with reference to the control data flow graph. The control program and relevant data are previously installed from a computer-readable recording medium (e.g., a FD, a CD (optical disc), etc.) into the ROM 112.

The control portion 111 comprises a CPU (central processing unit). The control portion 111 successively executes function of a CDFG generating section 111A, a scheduling section 111B, an allocation section 111C, a data path generating section 111D, and a controller generating section 111E, based on the control program.

The CDFG generating section 111A generates a model (called "CDFG"), which is composed of node(s) representing various processing functions (e.g., operations) and branch(es) representing a flow of data, by analyzing a data flow in an algorithm description (behavioral description). Input branches each represent data which is input to various processing functions (e.g., operations, etc.). Each node also has information about the type of an operation.

A CDFG comprises a loop process portion and a loop control portion. The loop control portion is provided within the loop process portion. In the loop process portion, nodes contained in a loop process are divided into pipelined stages. The processes in the pipelined stages are executed in parallel during each loop process. When the loop process is not executed, the loop control portion can output a control signal for undergoing a non-loop process to each node.

The scheduling section 111B determines when each node in the CDFG is executed. The scheduling section 111B divides the nodes in the CDPG into several steps. Nodes contained in a single step are executed during one clock cycle.

The allocation section 111c has a register determining section for determining a register in which data represented by a branch in the CDPG is to be stored, and an operator determining section for determining which operator is used to execute an operation function represented by a node in the CDFG. Note that in some behavioral synthesis systems, the process executed by the allocation section 111C precedes the process executed by the scheduling section 111B.

The data path generating section 111D generates a data path.

The controller generating section 111E generates a controller. Thereby, RTL (register transfer level) hardware (circuit diagram) is automatically synthesized (designed).

Hereinafter, a method for pipelining a loop process according to the present invention will be described in detail by way of embodiments with reference to the drawings.

(Embodiment 1)

In Embodiment 1, the loop process pipelining method is applied to the behavioral description of FIG. 14.

Figure 2:
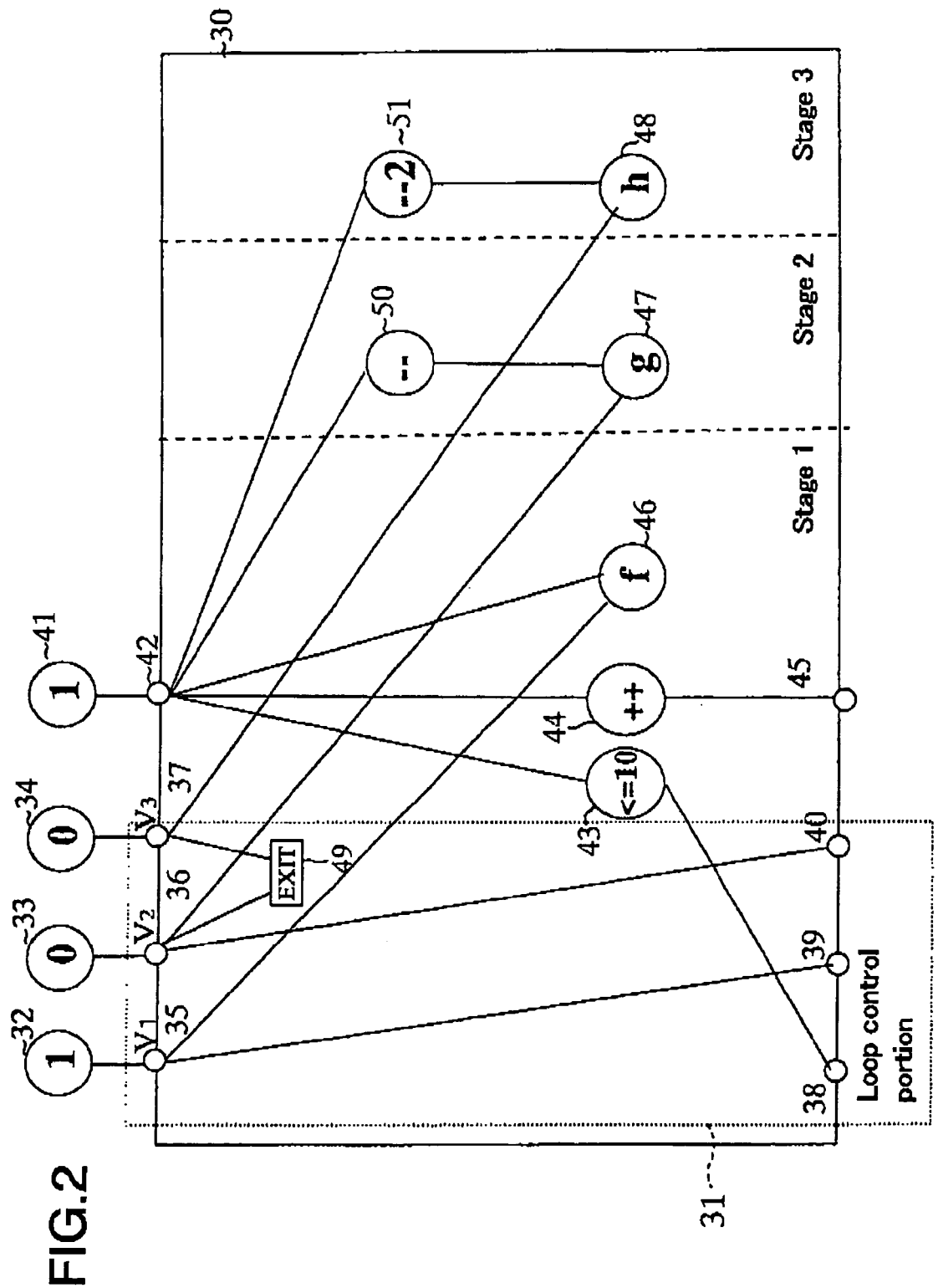
FIG. 2 is a diagram showing a CDFG, in which a loop process in a behavioral description of FIG. 14 is pipelined with a loop process pipelining method according to Embodiment 1 of the present invention.

FIG. 2 is a diagram showing a CDFG, in which a loop process in the behavioral description of FIG. 14 is pipelined with the loop process pipelining method according to Embodiment 1 of the present invention.

In the CDFG of FIG. 2, the non-loop process consisting of the prologue portion 20 and the epilogue portion 29 contained in the CDFG (FIG. 17) obtained by the conventional method is removed, and a loop control portion 31 is provided in a loop process portion 30. The loop control portion 31 outputs, to each pipelined stage constituting a loop process, control signals V1 to V3 for controlling the loop process and the non-loop process of nodes (operation processing section) in the stages. Output signal lines (output branches) from the loop control portion 31 are connected to nodes for executing operations, which constitute the loop process portion 30. The value of a node 41 for providing an initial value to a repetition variable "i" is set to be "1".

The loop control portion 31 contained in the loop process portion 30 will be described below.

In FIG. 2, the loop control portion 31 is provided with a number of loop control variables corresponding to the number of pipeline stages. In FIG. 2, the number of pipeline stages is three, the loop control portion 31 is provided with three loop control variables V1, V2 and V3, which correspond to ports 35, 36 and 37. These loop control variables V1, V2 and V3 are each a variable which represents one bit data, "0" or "1".

The control variable V1 serves as a control signal for controlling a process contained in a stage 1 which is obtained by pipelining a loop process. The control variable V2 serves as a control signal for controlling a process contained in a stage 2 which is obtained by pipelining a loop process. The control variable V3 serves as a control signal for controlling a process contained in a stage 3 which is obtained by pipelining a loop process.

A node 32 provides an initial value "1" to the control variable V1. Nodes 33 and 34 provide an initial value "0" to the loop control variables V2 and V3, respectively. The port 35 is connected to a port 39. The port 36 is connected to a port 40. Therefore, the control variables V1 and V2 are transferred to the variables V2 and V3 in the next loop. The CDFG of the loop control portion 31 has a structure similar to that in which three 1-bit registers are connected in series. Such a structure is realized by a 3-bit shift register as hardware (circuit diagram). In addition, a result of determining a terminating condition output from a determination node 43 is input to a port 38.

The port 35 is connected to a node 46 in a manner that allows the node 46 to execute an operation f only during each clock cycle when the variable V1 is "1". Thus, the node 46 is driven and controlled by the control variable V1. The port 36 is connected to a node 47 in a manner that allows the node 47 to execute an operation g only during each clock cycle when the variable V2 is "1". Thus, the node 47 is driven and controlled by the control variable V2. The port 37 is connected to a node 48 in a manner that allows the node 48 to execute an operation h only during each clock cycle when the variable V3 is "1". Thus, the node 48 is driven and controlled by the control variable V3. Therefore, the operation f, the operation g, and the operation h can be executed the same number of times as that of FIG. 16.

Next, a node 49 will be described.

The node 49 is connected to the port 36 and the port 37, so that the control variables V2 and V3 are input to the node 49. When the variable V2 is "0" and the variable V3 is "1", a process ending instruction is provided to the controller (not shown) so that the process of the loop process portion 30 is ended. Therefore, after the 12$^{th}$ cycle (FIG. 3), all processes are completed.

In the node 43, during the 10$^{th}$ cycle, it is determined whether or not the number of repetitions of the loop process reaches a prescribed number. However, subsequently, the process is continued in the loop process portion 30 a number of times corresponding to the epilogue portion 29 (FIG. 17) (2 cycles). The loop process is no longer executed after 10 repetitions.

According to the above-described method, even if the number of repetitions of a loop process is not fixed, the loop process and a non-loop process including an epilogue portion can be executed a necessary and minimum number of times.

In the CDFG of FIG. 2, the value of the node 41, which provides an initial value to the loop variable i, is set to be "1". This is because processes (i=1, 2) in the prologue portion 20 (FIG. 17) are executed within the loop process portion 30.

In the behavioral description of FIG. 14, the loop process is executed 10 times. When it is determined whether or not a loop is repeated, within a conditional expression in the loop (e.g., a "while" loop in the C language), the process may be ended after only one loop is executed. For example, if the node 43 (FIG. 2) of the CDFG is represented by another comparative expression which is false after execution of a first loop, "0", is input to the port 38 during a first cycle.

In this case, the variables V1, V2 and V3 change as shown in FIG. 4. After three cycles, the execution of the loop is ended in the node 49. In FIG. 4, the variables V1, V2 and V3 each become "1" during one cycle. Therefore, functions f, g and h are each executed once.

Thus, by using the loop control portion 31 of Embodiment 1, it is possible to cause a circuit to behave in an appropriate and efficient manner even when the number of repetitions of a loop is small.

Next, the nodes 46, 47 and 48 of the loop process portion 30 will be described.

Two values are input to the node 46. One is the variable i which is output from the port 42. The other is the variable V1 which is output from the port 35. The node 46 executes f(i) only when the variable V1 is "1".

Figure 17:
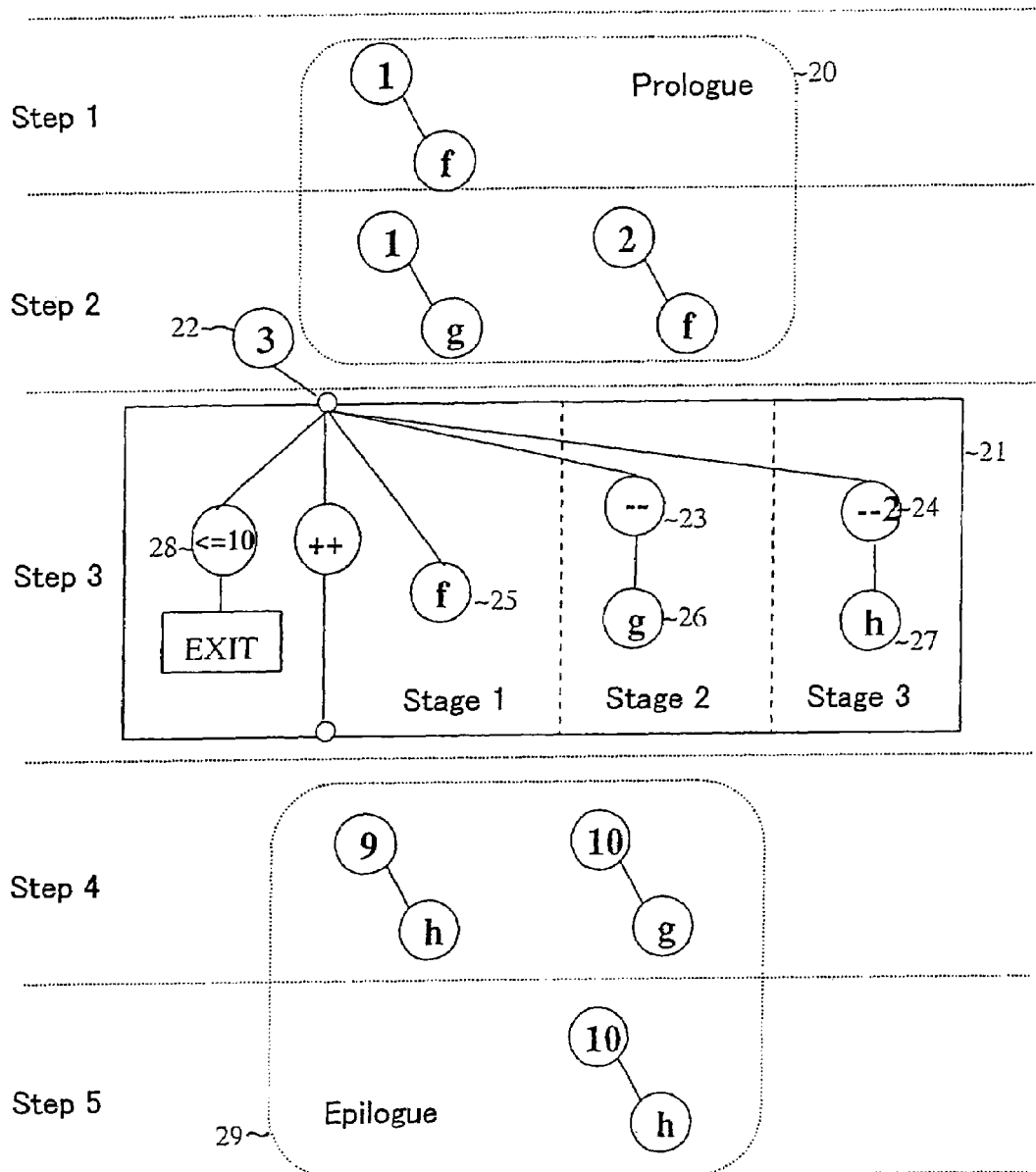
FIG. 17 is a diagram showing an exemplary CDFG pipelined using a conventional method.

It is now assumed that the function f is a process, such as addition, multiplication, or the like, the result of which has no action external to the loop process. Even if f is executed when the variable V1 is "0", the result of the operation is not used and therefore there is no substantial damage. Therefore, in such a case, it is not necessary to control the execution of the node 46 by using the variable V1. Therefore, the node 46 may always execute the function f, as with the node 25 (FIG. 17).

On the other hand, it is assumed that the function f is a process, such as memory writing, communication, or the like, which has an action external to the loop process. It is necessary that the process is executed only when the variable V1 is "1". This is because if the function f is executed when the variable V1 is "0", the behavior of the loop is altered when viewed externally.

Specifically, to address the above-described situation, a simple circuit may be added in the following manner. In the case of memory writing, a logical product of a value represented by an enable signal and the variable V1 is calculated. In the case of communication, a logical product of a value represented by a request-for-communication signal and the variable V1 is calculated.

The nodes 47 and 48 function in a manner similar to that of the node 46.

Next, nodes 50 and 51 will be described.

The nodes 50 and 51 are provided so as to execute functions g(i−1) and h(i−2) in parallel to the function f(i). For example, the function f(3), the function g(2), and the function h(1) are simultaneously executed. When the variable i is "1", the function f(1) is executed because the loop control variables V2 and V3 are "0". However, in this case, the functions g(0) and h(−1) are not simultaneously executed.

As described above, if the functions g and h have no action external to the loop, there is no substantial damage even when the functions g(0) and h(−1) are executed. Therefore, it is not necessary to perform control using the loop control variables V2 and V3.

When the variable i is 12, the variables V1 and V2 are "0". Therefore, in this case, only the function h(10) is executed while the functions f(12) and g(11) are not executed. Similarly, if the functions f and g have no action external to the loop process, the functions f(12) and g(11) may be executed.

(Embodiment 2)

In Embodiment 2, the loop process pipelining method of the present invention is applied to a behavioral description of FIG. 5.

FIG. 5 is a diagram showing another exemplary behavioral description including a loop process.

In the behavioral description of FIG. 5, a variable i is written into an array a and the result of addition of i and j is written into an array b while i<10 is satisfied, where the variable i is incremented by one from i=0. The initial value of j is 5, and i+j is used as j for the next loop.

Figure 6:
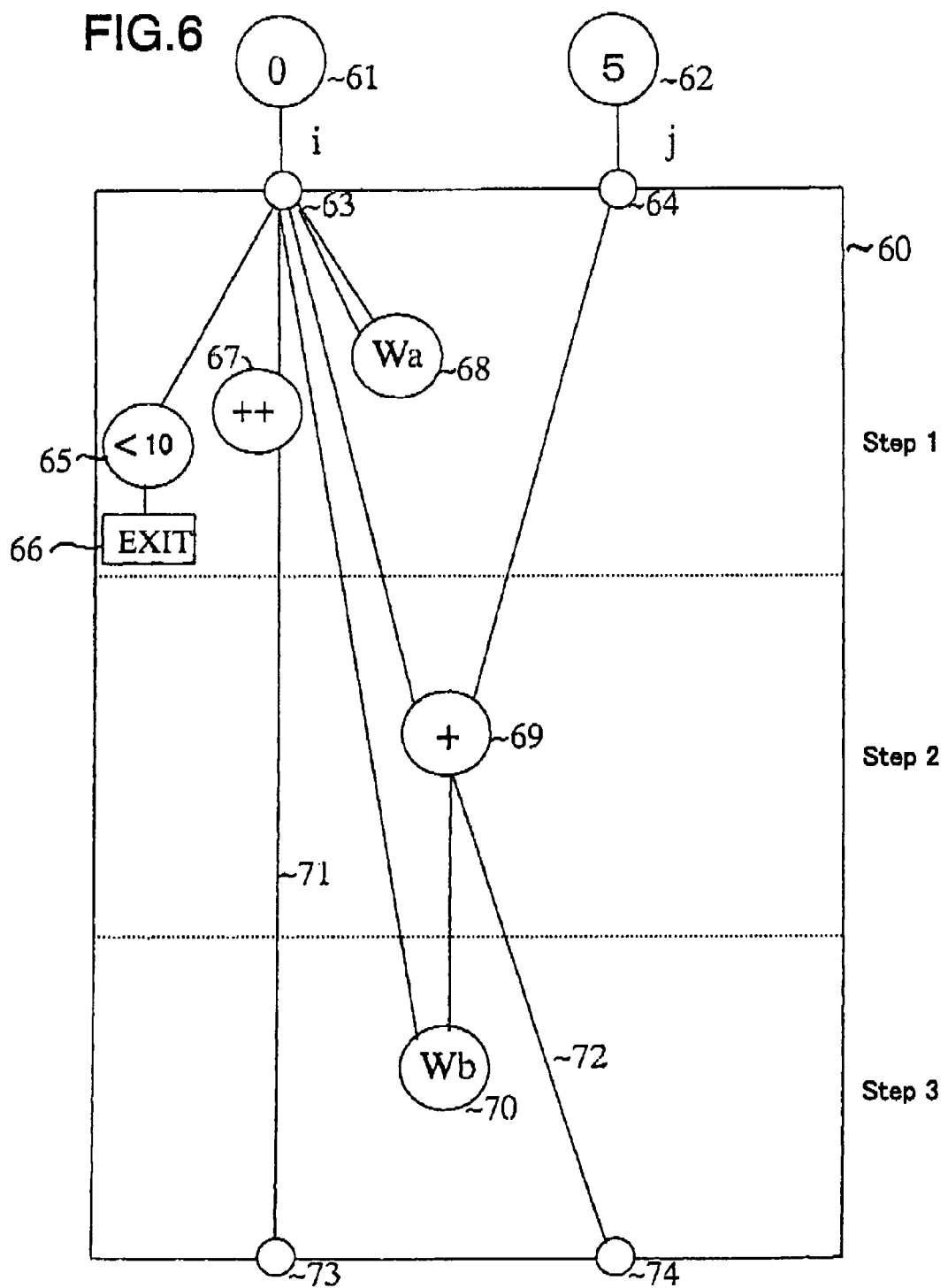
FIG. 6 is a diagram showing a CDFG for the behavioral description of FIG. 5, in which the loop process is not pipelined.

FIG. 6 is a diagram showing a CDFG for the behavioral description of FIG. 5, in which the loop process is not pipelined.

In FIG. 6, a rectangle 60 represents a loop (loop process portion 60), in which a portion of the CDFG contained in the loop process portion 60 is repeatedly executed. A port 63 at an upper end of the rectangle 60 represents the variable i, while a port 64 represents the variable j. The variable i stored in the port 63 is incremented by one by an increment operation node 67, and is transferred via a branch 71 to a port 73. The data reaching the port 73 is fed back to the port 63 and is used as the variable i for the next loop.

In a node 65, a terminating condition is examined. If the result is true (i≦10), the node 65 outputs "1". If the result is false, the node 65 outputs "0". In a node 66, if the input is "0", the process of the loop process portion 60 is ended. An instruction is provided to the controller (not shown) to be transferred to the next state.

Nodes 61 and 62 each output a constant. The node 61 is provided with an initial value "0" of the loop variable i, while the node 62 is provided with an initial value "5" of the loop variable j. These values are used during a first loop of the loop process portion 60. In a second loop and thereafter, the values of the ports 73 and 74 are used.

A node 68 represents writing into an array a. The node 68 is provided with two inputs. The left-hand input represents the index of the array a, while the right-hand input represents data to be written into the array a. In this case, the variable i is written into the array a. A node 69 represents addition, in which the two inputs i and j are added with each other. The result of the addition is transferred via a branch 72 to a port 74, and is then fed back to the port 64 and is used as the variable j for the next loop. A node 70 represents writing into an array b. The node 70 is provided with two inputs. The left-hand input represents the index of the array b, while the right-hand input represents data to be written into the array b. In this case, the result of the addition in the node 69 is written into the array b.

In the CDPG of FIG. 6, the node 67 and 68 are scheduled into step 1, the node 69 is scheduled into step 2, and the node 70 is scheduled into step 3.

In this scheduling, one loop requires three cycles. Therefore, 10 loops requires 30 cycles.

In the case of a simple behavioral description (FIG. 14), it is relatively easy to produce a pipelined CDFG (FIG. 2). However, when data is transferred between each step as in the behavioral description of FIG. 5, it is necessary to determine data transfer in a pipelined process while considering data transfer between each loop, resulting in a complicated procedure.

In such a case, a method for producing a CDFG of a pipelined loop based on a CDFG (FIG. 6) of an unpipelined loop process is useful. This method will be described with reference to FIG. 7.

Figure 7:
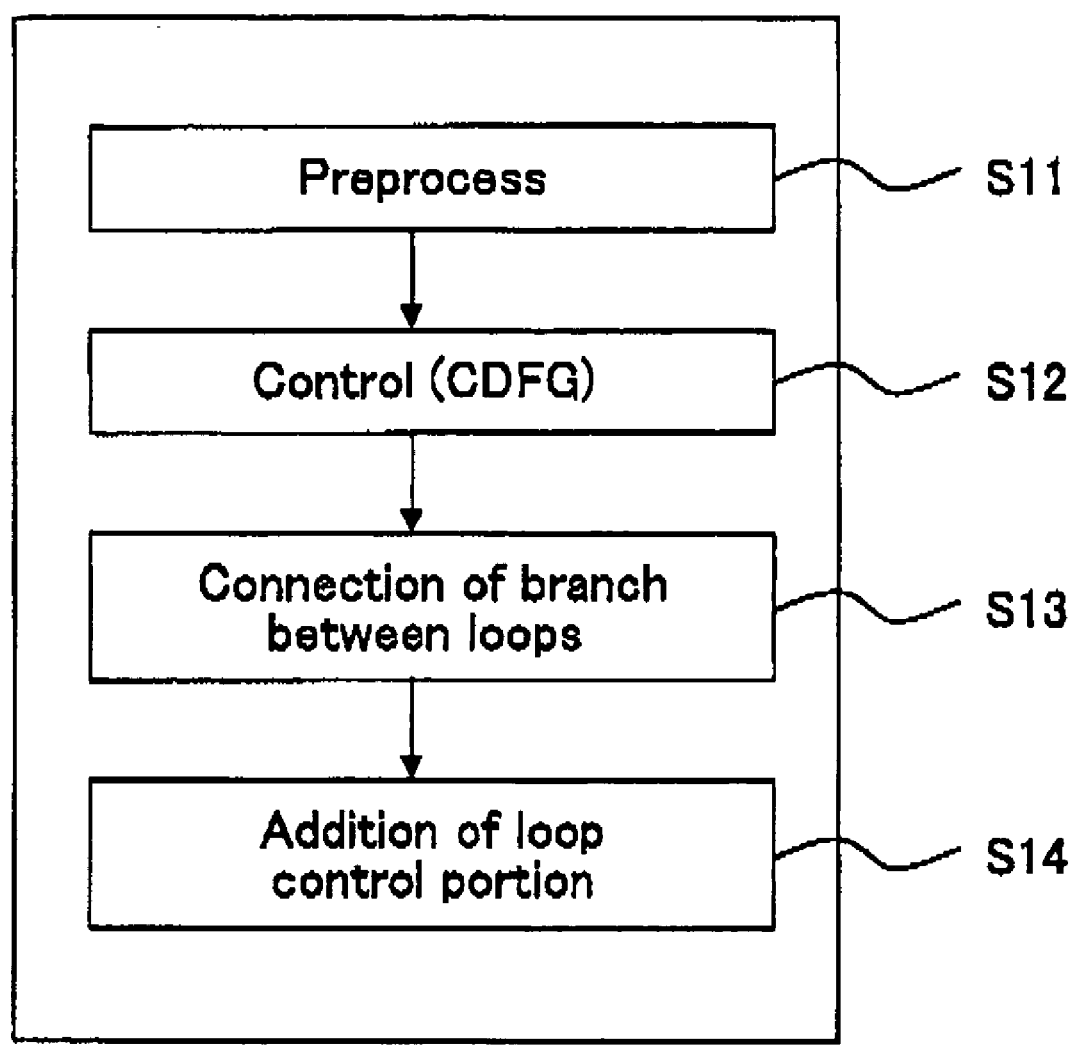
FIG. 7 is a flow chart showing a pipelined process in a CDFG according to Embodiment 2 of the present invention.

FIG. 7 is a flow chart showing a pipelined process in the CDFG of Embodiment 2.

A method shown in FIG. 7 is programmed and applied to a CDFG including an unpipelined loop process, which is stored in the database 114 on a computer (computing machine). Thereby, it is made possible to automatically synthesize a CDFG of a pipelined loop process on a computer (computing machine) (e.g., the CDFG generating section 111A).

Hereinafter, each step of the loop process pipelining method of FIG. 7 will be described. In this example, the number of pipeline stages is assumed to be "3".

In a preprocess (step S11), as shown in FIG. 8A, ports 81, 82, 83 and 84 are newly added to intersections of boundary portions between stages and graph branches in the unpipelined CDFG (FIG. 6). Since the number of pipeline stages is three, steps 1 to 3 of FIG. 6 correspond to stages 1 to 3 of FIG. 8A.

In this case, the branches 71 and 72, which are connected to the respective port 73 and 74 for repeating a loop process (FIG. 6), are used to transfer data to the next loop.

In the next step S12, the branches 71 and 72 are temporarily removed because data transfer is considered within the same loop. The branches 71 and 72 are considered in step S13.

Figure 8B:
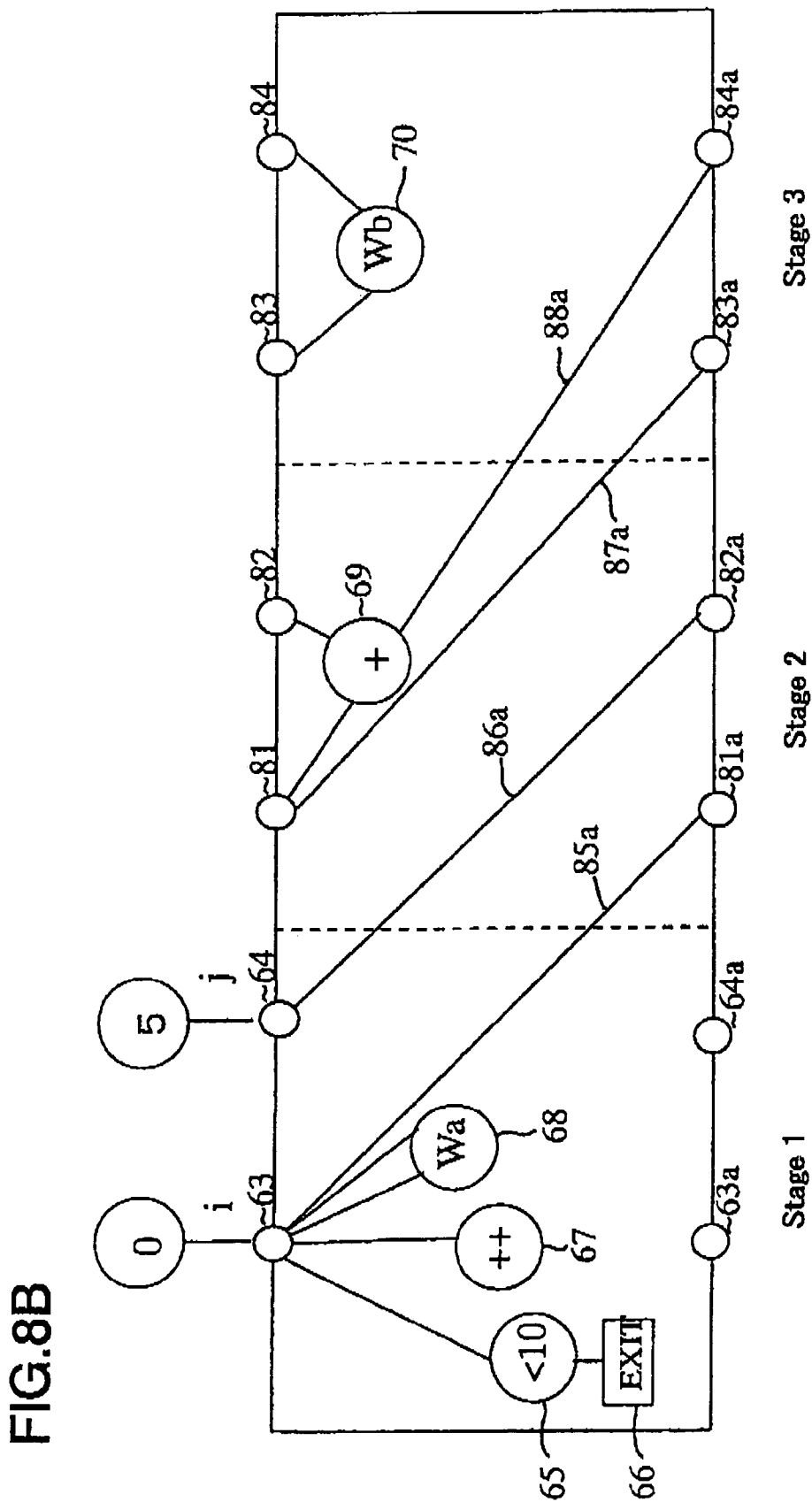

Next, the CDFG is modified (data flow graph modifying process) (step S12). In this step, the CDFG of the stages preprocessed in step S11 are arranged side by side as shown in FIG. 8B so that the stages are processed in parallel. In FIG. 8B, stages 1 to 3 are arranged from the left to the right.

In FIG. 8B, the ports 63 and 64 correspond to the variables i and j, respectively. In FIG. 8A (not pipelined), a branch 85 connects the port 63 with the port 81. Data at the port 83 is used at the port 81 in the next cycle.

In FIG. 8B (pipelined), a value at the port 63 needs to be transferred to the port 81 during the next loop. Therefore, in FIG. 88, the port 63 is connected via a branch 85a to a port 81a but not the port 81. Therefore, the variable i at the port 63 is transferred from the port 81a to the port 81 and is then input to the node 69 during the next loop.

The same is true of other branches, i.e., a port is connected to a branch so that data is transferred during the next loop. For example, a branch 86 connecting the ports 64 and 82 in FIG. 8A corresponds to a branch 86a connecting the ports 64 and 82a in FIG. 8B. A branch 87 connecting the ports 81 and 83 in FIG. 8A corresponds to a branch 87a connecting the ports 81 and 83 in FIG. 8B. A branch 88 connecting the the node 69 and the port 84 in FIG. 8A corresponds to a branch 88a connecting the node 69 and the port 84a in FIG. 8B.

Figure 8C:
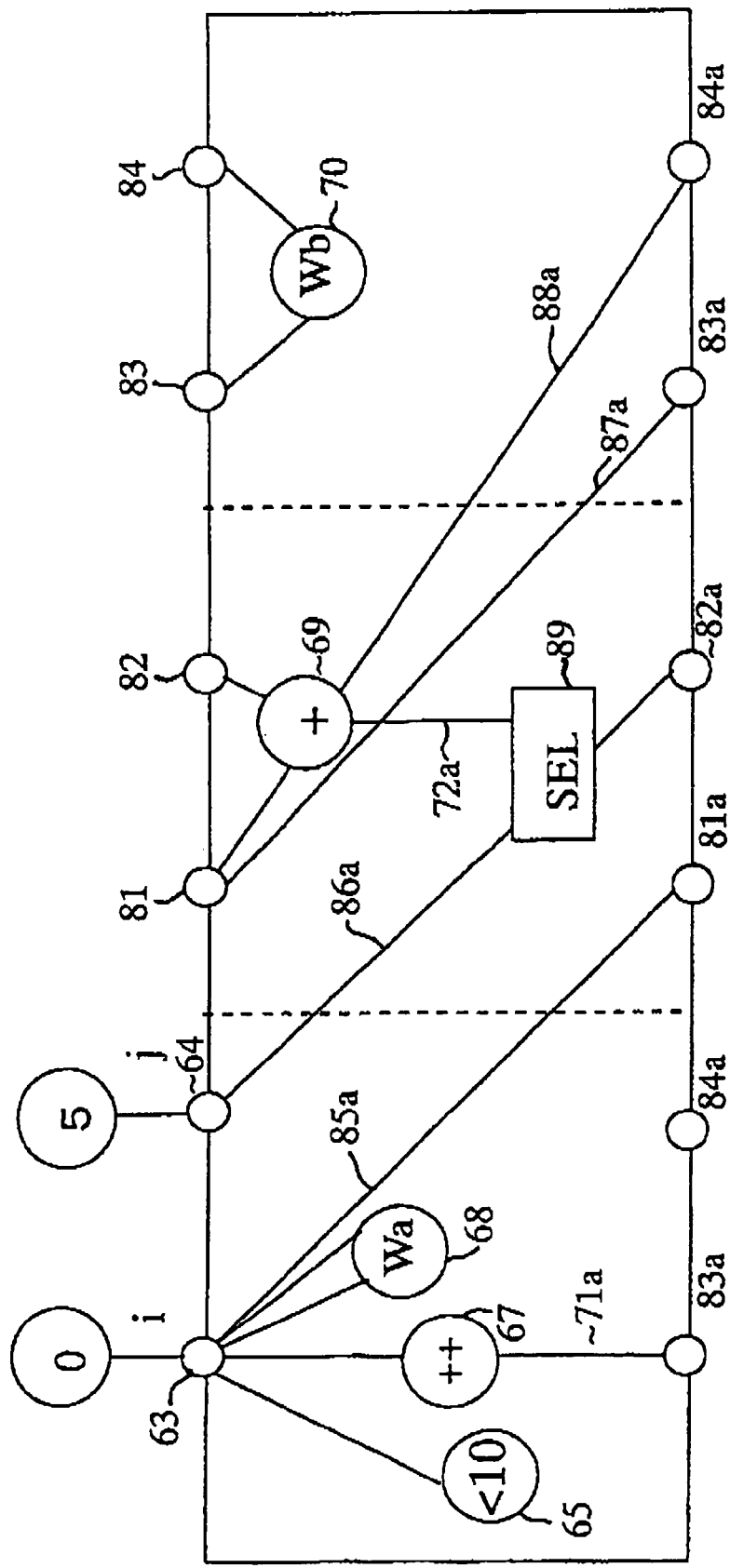

Next, in step S13, a data transfer branch is connected between loops. In this step, branches 71a and 72a corresponding to the branches 71 and 72 (FIG. 6) connected to the ports for repeating a loop process, are connected as shown in FIG. 8C.

In this case, the difference in stage between a node outputting data to a branch and a node which will use the data in the next stage is considered in an unpipelined CDFG (FIG. 6).

Figure 9:
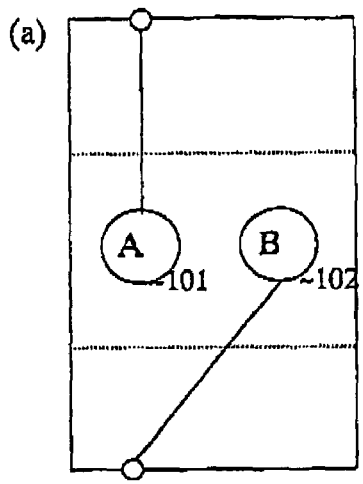
FIG. 9 is a diagram showing a process for connecting a branch between loops.
Figure 9:
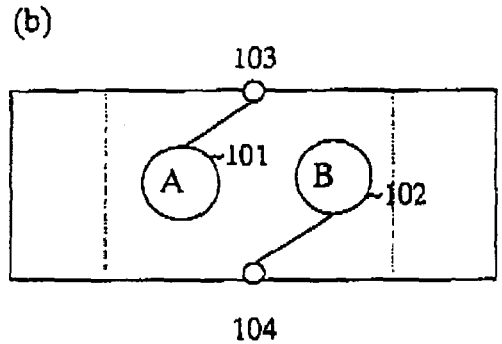
Figure 9:
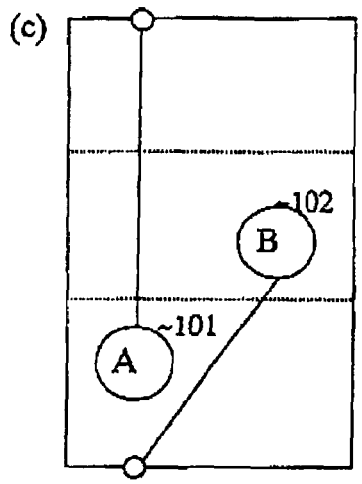
Figure 9:
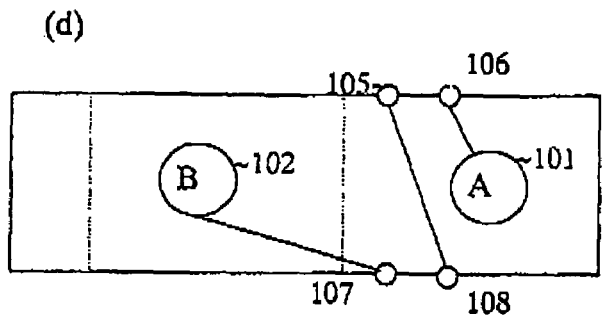
Figure 9:
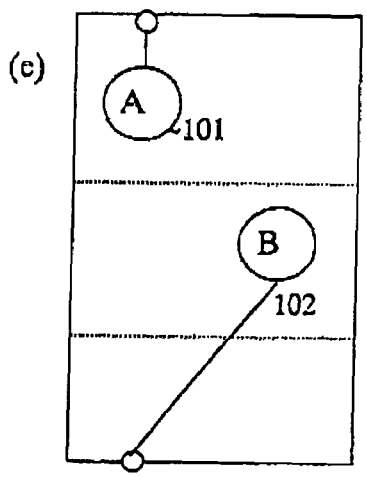
Figure 9:
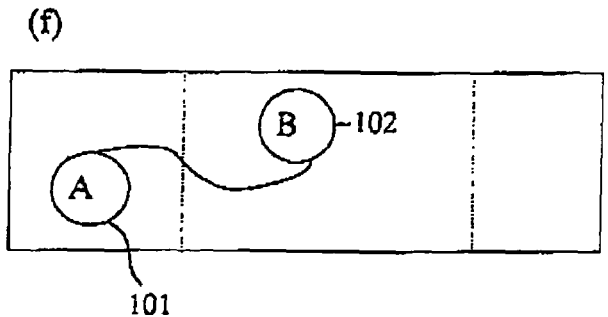
Figure 15:
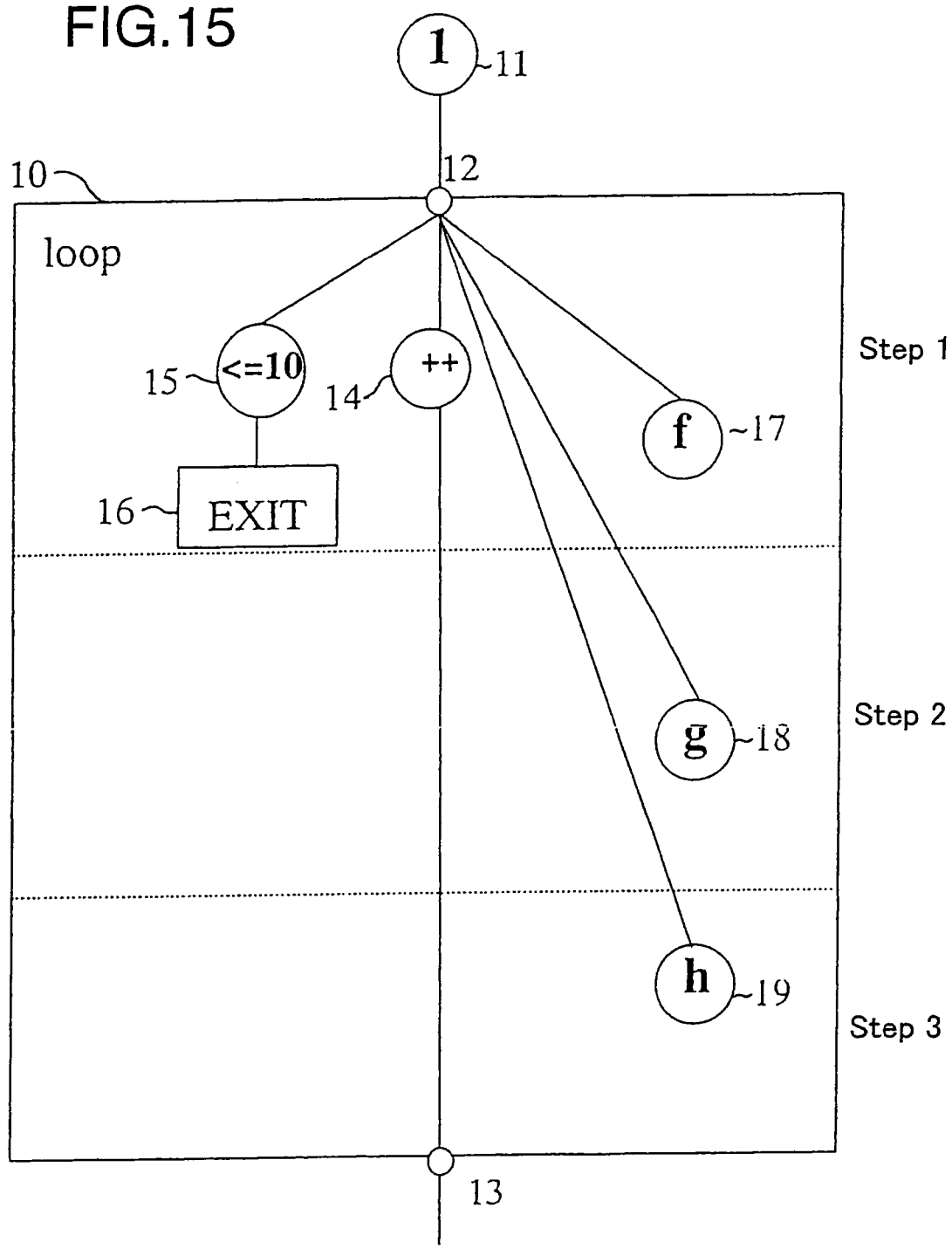
FIG. 15 is a diagram showing an unpipelined CDFG corresponding to the behavioral description of FIG. 14.

FIG. 9 is a diagram showing how to pipeline depending on the stage difference between two nodes.

A portion (a) of FIG. 9 shows a CDFG, in which a B node 102 which outputs data and an A node 101 which receives data are contained in the same stage when a loop is not pipelined. It is now assumed that such a CDFG is pipelined. If one stage is executed during one cycle, i.e., stages are executed for each cycle, data generated by the execution of the B node 102 is used by the A node 101 during the next loop, one clock cycle after the execution of the B node 102. Therefore, in a pipelined CDFG ((b) of FIG. 9), the B node 102 is connected to a port 104 so that data output from the B node 102 is input to the A node 101 during the next loop. During the next loop, the A node 101 is connected to a port 103 to which data is supplied from the port 104.

A portion (c) of FIG. 9 shows a CDFG when a loop is not pipelined, in which the B node 102 which outputs data is scheduled one stage before the A node 101 which receives data. It is assumed that this CDFG is pipelined. In this case, data generated by the execution of the B node 102 is used in the A node 101 during the next loop, two clock cycles after the execution of the B node 102. Therefore, in a pipelined CDFG ((d) of FIG. 9), the B node 102 is connected to a port 107 in the next step so that data output from the B node 102 is input to the A node 101 after two loop repetitions. A port 105, into which data from the port 107 is input during the next loop, is connected to a port 108. The A node 101 is connected to a port 106, into which data from the port 108 is input during the next loop.

Similarly, when the B node is scheduled n stages before the A node, a port representing a loop (e.g., the ports 105 and 108) are added after n+1 loop repetitions ((d) of FIG. 9).

A portion (e) of FIG. 9 shows a CDFG when a loop is not pipelined, in which the B node 102 which outputs data is scheduled one stage after the A node 101 which receives data. It is now assumed that this CDFG is pipelined. In this case, the B node 102, and the node 101 which is executed during the next loop, are executed during the same clock cycle. Therefore, in a pipelined CDPG ((f) of FIG. 9), the B node 102 and the A node 101 are directly connected to each other.

In the case of a CDFG when a loop is not pipelined, in which the B node 102 which outputs data is scheduled two or more stages after the A node 101 which receives data, it is impossible to pipeline a loop. Such a CDFG is not discussed herein.

For example, in FIG. 6, a node, which outputs data to the branch 71, is the node 67. A node, which uses the data during the next loop, is also the node 67. Therefore, the stage difference is "0". Therefore, branch connection is made as shown in (b) of FIG. 9. In this case, the port 63, the node 67, and the port 83a are connected to the branch 71a as shown in FIG. 5C.

A node, which outputs data to the branch 72, is the node 69. A node, which uses the data during the next loop, is the node 69. Therefore, the stage difference is "0". Therefore, branch connection is made as shown in (b) of FIG. 9. In this case, another branch 86a is connected to the port 82a. Therefore, as shown in FIG. 5C, a selector node 89 is inserted to connect to the branch 72a. The selector node 89 is controlled so as to output the value of the port 64 only during the first cycle, and output the result of the operation of the node 69 to the port 82a during the subsequent cycles. The initial value of the variable j in the behavioral description of FIG. 5 is input to the port 64. During the first loop, the initial value of the variable j is used, and subsequently, the output of the node 69, which is calculated within the loop, is used.

Figure 8D:
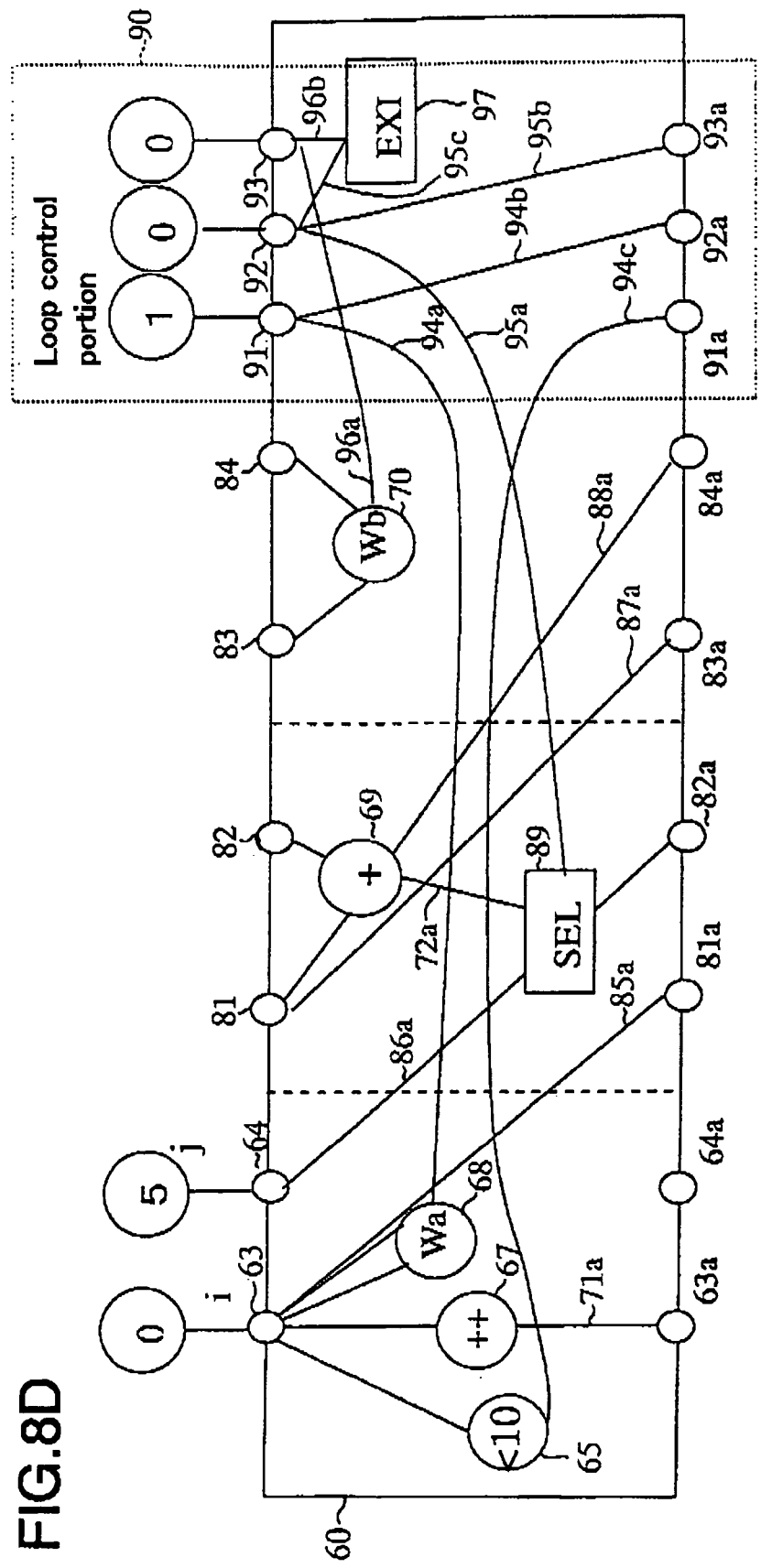

Next, in a process of adding a loop control portion in step S14 (FIG. 7), a loop control portion 90 is added to the CDFG as shown in FIG. 8D.

In FIG. 8D, the CDFG of FIG. 6 is pipelined using three stages. Therefore, three loop control variables V1, V2 and V3 are required. Ports 91, 92 and 93 output the variables V1, V2 and V3, respectively.

The control variable V1 is represented by a control signal which controls a process contained in stage 1 when a loop is pipelined. The control variable V2 is represented by a control signal which controls a process contained in stage 2. The control variable V3 is represented by a control signal which controls a process contained in stage 3. An initial value "1" is provided to the control variable V1, while an initial value "0" is provided to the control variables V2 and V3.

The port 91 is connected via a branch 94b to the port 92a and the port 92 is connected via a branch 95b to the port 93a so that the values of the control variables V1 and V2 are provided to the control variables V2 and V3 during the next loop.

The result of determination of the loop terminating condition executed by the node 65 is input via a branch 94a to the port 91a. If the loop terminating condition is "true", "0" is input to the port 91a.

A node 97 for determining termination is connected via branchs 95c and 96b to the ports 92 and 93. An instruction is provided to a controller (not shown) so that if the control variable V2 is "0" and the control variable V3 is "1", the loop process is ended.

The ports 91 and 93 are connected via branches 94a and 96a to the node 6B in stage 1 and the node 70 in stage 3, respectively. The control variable V1 is "1" during the first to the $10^{th}$ cycles, and "0" during the $11^{th}$ and $12^{th}$ cycles as shown in FIG. 3. Therefore, writing to the array a is executed during the first cycle to the $10^{th}$ cycle in the node 68. Writing to the array a is not executed during the $11^{th}$ and $12^{th}$ cycles in the node 68. The control variable V3 is "0" during the first and second cycles, and "1" during the third cycle to the $12^{th}$ cycle as shown in FIG. 3. Therefore, writing to the array b is not executed during the first and second cycles in the node 70. Writing to the array b is executed during the third to $12^{th}$ cycles. The node 68 which executes writing to the array a and the node 70 which executes writing to the array b, are controlled to functions as the prologue portion and the epilogue portion, respectively.

The control variable V2 output by the port 92 is input via a branch 95a to the selector node 89. The control variable V2 is "0" during the first cycle and "1" during the second to $11^{th}$ cycles as shown in FIG. 3. Therefore, during the first cycle, the value of the port 64 connected to the left-hand input of the selector node 89 is output. During the second cycle and thereafter, the result of an operation in the node 69 connected to the right-hand input is output. Thus, only during the first cycle, an initial value output from the externally connected port 64 is selected. Thereafter, the results of operations within the loop are selected. The control variable V2 is "0" during the $12^{th}$ cycle, so that the value of the port 64 is selected during the $12^{th}$ cycle. Since the loop process is ended after the $12^{th}$ cycle, the behavior of the selector node 89 during the $12^{th}$ cycle has n influence on the behavior of the whole circuit.

Thus, as another embodiment of the CDFG generating section 111A, a port adding section for newly adding a port to an intersection of boundary portions between stages and graph branches in the unpipelined CDPG, a side-by-side arranging section for arranging stages side by side so as to represent parallel processing, a branch connecting section for connecting a data transfer branch between loops in the side-by-side arranged CDFG, and a loop control portion adding section for adding a loop control portion to a loop process portion, are provided.

With the above-described procedure, it is possible to obtain a CDFG, in which a loop process is pipelined, from a CDFG, in which the loop is not pipelined.

Thus, it is possible to synthesize hardware for realizing a behavioral description by producing a CDFG, in which a loop process is pipelined, and executing an allocation process, a data path generating process, a controller generating process, and the like, as shown in FIG. 10.

Therefore, according to Embodiments 1 and 2, when a loop process is pipelined, a CDFG is produced, in which a pipelined stage constituting the loop process portion 30 or the loop process portion 60 is provided with the loop control portion 31 or the loop control portion 90 which outputs the control signals V1 to V3 for controlling a clock cycle, in which each node contained in the pipelined stage is executed, and a clock cycle, in which a non-loop process is executed, to the nodes 46 to 48 or the nodes 68 to 70. Thereby, it is possible to pipeline a loop process in a CDFG with a smaller area in behavioral synthesis where hardware (designed circuit diagram) is synthesized from its behavioral description.

According to the present invention, a pipelined control data flow graph (CDFG) is generated from a behavioral description containing a loop process and a non-loop process. The control data flow graph comprises a loop process portion representing that the nodes contained in the loop process are divided into pipelined stages and processes of the pipelined stages are executed in parallel in each of a plurality of the loop processes. A loop control portion is provided within the loop process portion, which outputs control signals for executing at least the non-loop process of the loop process and the non-loop process, to the nodes in the stages.

Therefore, the non-loop process can be executed by the pipelined loop process portion without providing a conventional prologue portion and epilogue portion.

As a result, it is possible to avoid an increase in the area of hardware structure and an increase in cost, which are problems in conventional loop process pipelining methods. In addition, a loop process can be pipelined without malfunction, even when a loop process is ended before the completion of a prologue portion or even when the number of loop process repetitions is not constant.

Various other modifications will be apparent to and can be readily made by those skilled in the art without is departing from the scope and spirit of this invention. Accordingly, it is not intended that the scope of the claims appended hereto be limited to the description as set forth herein, but rather that the claims be broadly construed.

What is claimed is:

1. A behavioral synthesis system, comprising:
    a section for generating a control data flow graph from a behavioral description containing a loop process and a non-loop process, using nodes representing processing sections and input/output branches representing data flow; and
    a section for automatically synthesizing hardware structure at a register transfer level using the control data flow graph,
    wherein a loop process portion of the control data flow graph represents that the nodes contained in the loop process are divided into pipelined stages and processes of the pipelined stages are executed in parallel in each of a plurality of the loop processes, and
    the control data flow graph generating section comprises, in the loop process portion, a loop control portion for outputting control signals for executing at least the non-loop process amongst the loop process and the non-loop process, to the nodes in the stages.

2. The behavioral synthesis system according to claim 1, wherein the loop control portion comprises:
    a plurality of ports for outputting the control signals to the nodes in the stages; and
    a terminating condition determining node for determining termination, the terminating condition determining node being connected to one or more prescribed ports of the plurality of ports.

3. The behavioral synthesis system according to claim 2, wherein the plurality of ports have a shift register function having the same number of bits as the number of the pipelined stages.

4. The behavioral synthesis system according to claim 3, wherein the plurality of ports supply control signals obtained by successively shifting a prescribed input initial value for each cycle using the shift register function, to the nodes in the stages.

5. The behavioral synthesis system according to claim 1, wherein the loop process portion comprises:
    a loop port for receiving a prescribed initial value and successively outputting a value obtained by incrementing the input initial value by one per cycle;
    a number-of-loops determining node for counting an output from the loop port, determining whether or not the number of loop processes reaches a prescribed number of loop processes, and outputting a result of the determination as a determination output to the loop control portion; and
    the nodes in the stages.

6. The behavioral synthesis system according to claim 5, wherein the loop control portion receives the determination output from then number-of-loops determining node, and outputs the control signal for allowing the node in the stage to execute a non-loop process, from the port of the loop control portion.

7. The behavioral synthesis system according to claim 1, wherein a node of the nodes in the stages, which has an action external to the loop process portion, is controlled using the control signal from the loop control portion.

8. The behavioral synthesis system according to claim 1, wherein the control data flow graph generating section generates a control data flow graph of a pipelined loop process based on a control data flow graph of an unpipelined loop process.

9. The behavioral synthesis system according to claim 8, wherein the control data flow graph generating section comprises:
    a port adding section for newly adding a port at an intersection of a boundary between the stages and a graph branch in the control data flow graph of the unpipelined loop process;
    a side-by-side arranging section for arranging the stages to represent parallel processing;
    a branch connecting section for connecting a data transfer branch between loops with respect to the stages in the loop process portion; and
    a loop control portion adding section for providing the loop control portion in he loop process portion.

10. The behavioral synthesis system according to claim 9, wherein the branch connecting section generates a selector node for selecting one of an initial value provided externally to the loop process portion and a value calculated by the loop process portion and substituting the selected value to a variable in the loop process portion, and
    the loop control portion adding section connects the loop control portion and the selector node so that the control signal output from the loop control portion is used to determine which of the initial value provided externally to the loop process portion and the value calculated by the loop process portion is selected.

11. A method for producing a logic circuit based on a circuit structure automatically synthesized using a behavioral synthesis system according to claim 1.

12. A behavioral synthesis method, comprising the steps of:
  generating a control data flow graph from a behavioral description containing a loop process and a non-loop process, using nodes representing processing sections and input/output branches representing data flow; and
  automatically synthesizing hardware structure at a register transfer level using the control data flow graph,
  wherein the control data flow graph generating step comprises:
  dividing the nodes contained in the loop process into pipelined stages;
  generating a loop process portion for executing processes of the pipelined stages in parallel in each of a plurality of the loop processes; and
  generating, in the loop process portion, a loop control portion for outputting control signals for executing at least the non-loop process amongst the loop process and the non-loop process, to the nodes in the stages.

13. An apparatus having a central processing unit (CPU) and a memory coupled to said CPU, the memory storing a control program for causing the CPU to execute a behavioral synthesis method according to claim 12.

14. A computer program product comprising a computer-readable recording medium storing a control program for causing a computer to execute a behavioral synthesis method according to claim 12.

15. A logic circuit, comprising:
  a loop process portion for repeatedly executing operations in parallel using a plurality of logical operation sections; and
  a loop control portion for outputting a control signal, for executing at least the non-loop process amongst a loop process and a non-loop process, to at least one of the plurality of logical operation sections,
  wherein the loop control portion is provided within the loop process portion.

* * * * *